United States Patent
Böhm et al.

(10) Patent No.: US 11,543,387 B2
(45) Date of Patent: Jan. 3, 2023

(54) METHOD FOR CHARACTERIZING A WELD

(71) Applicants: VOLKSWAGEN AKTIENGESELLSCHAFT, Wolfsburg (DE); PLR Prüftechnik Linke & Rühe GmbH, Magdeburg (DE)

(72) Inventors: Dennis Böhm, Wolfenbüttel (DE); Alexander Breuer, Celle (DE); Karsten Dilz, Schwülper (DE); Mathias Kraken, Braunschweig (DE); Malte Schönemann, Braunschweig (DE); Patrick Zihrul, Braunschweig (DE)

(73) Assignees: VOLKSWAGEN AKTIENGESELLSCHAFT, Wolfsburg (DE); PLR PRÜFTECHNIK LINKE & RÜHE GMBH, Magdeburg (DE)

( * ) Notice: Subject to any disclaimer, the term of this patent is extended or adjusted under 35 U.S.C. 154(b) by 0 days.

(21) Appl. No.: 17/122,557

(22) Filed: Dec. 15, 2020

(65) Prior Publication Data

US 2021/0181150 A1    Jun. 17, 2021

(30) Foreign Application Priority Data

Dec. 16, 2019 (DE) ................. 10 2019 219 743.4

(51) Int. Cl.
*G01N 27/90* (2021.01)
*G01R 31/364* (2019.01)
*H01M 50/569* (2021.01)

(52) U.S. Cl.
CPC ....... *G01N 27/9006* (2013.01); *G01R 31/364* (2019.01); *H01M 50/569* (2021.01)

(58) Field of Classification Search
CPC .......... G01N 27/9006; G01N 27/9046; G01N 27/902; G01N 33/207; G01N 2291/267;
(Continued)

(56) References Cited

U.S. PATENT DOCUMENTS 3,693,075 A   9/1972 Forster
9,007,064 B2  4/2015 Widhalm
(Continued)

FOREIGN PATENT DOCUMENTS

CN    106198722 A   12/2016
CN    106778515 A   5/2017
(Continued)

OTHER PUBLICATIONS

Search report for German Patent Application No. 10 2019 219 743.4, dated Sep. 23, 2020.
(Continued)

*Primary Examiner* — Feba Pothen
(74) *Attorney, Agent, or Firm* — Pearl Cohen Zedek Latzer Baratz LLP

(57) ABSTRACT

A method for characterizing at least one joined connection between at least two components, whereby an eddy-current sensor is consecutively moved several times over the at least one weld, thereby generating a plurality of data sets of the detected measuring signals in various parallel sectional planes of the weld, and whereby, on the basis of the plurality of data sets, a projection data set is subsequently determined as the measure of the spatial distribution of the measuring signals along the at least one joined connection.

7 Claims, 3 Drawing Sheets

(58) Field of Classification Search
CPC .... G01R 31/364; H01M 50/569; Y02E 60/10; B23K 31/125
See application file for complete search history.

(56) References Cited

U.S. PATENT DOCUMENTS

| | | | |
|---|---|---|---|
| 9,494,558 B2* | 11/2016 | Kawata | G01N 27/9006 |
| 9,839,979 B2* | 12/2017 | Todorov | B23K 9/173 |
| 2002/0105325 A1 | 8/2002 | Goldfine et al. | |
| 2004/0239317 A1 | 12/2004 | Goldfine et al. | |
| 2012/0070721 A1 | 3/2012 | Han | |
| 2016/0274060 A1* | 9/2016 | Denenberg | G01N 27/9046 |

FOREIGN PATENT DOCUMENTS

| | | |
|---|---|---|
| CN | 107589174 A | 1/2018 |
| CN | 109900708 A | 6/2019 |
| DE | 26 07 783 A1 | 10/1977 |
| DE | 10 2012 025 004 A1 | 4/2014 |
| GB | 2016705 A | 9/1979 |
| JP | 2014-157078 A | 8/2014 |
| WO | WO 2016/185452 A1 | 11/2016 |

OTHER PUBLICATIONS

Search report for European Patent Application No. EP 20 21 4404, dated May 18, 2021.
Office Action for Chinese Patent Application 202011484737.7, dated Jul. 20, 2022.

* cited by examiner

METHOD FOR CHARACTERIZING A WELD

CROSS REFERENCE TO RELATED APPLICATION

This application claims priority from German Patent Application No. 10 2019 219 743.4, filed Dec. 16, 2019, which is incorporated herein in its entirety.

FIELD OF THE INVENTION

The invention relates to a method for characterizing a weld between at least two components. The invention also relates to a use of the method and to a device as well as to a vehicle battery.

BACKGROUND OF THE INVENTION

Motor vehicles that can be or are powered electrically such as, for instance, electric or hybrid vehicles, typically have an electric motor as the drive machine which is coupled to an electric (high-voltage) energy-storage means that is installed in the vehicle in order to supply the electric energy. Such energy-storage means are configured, for example, in the form of (vehicle) batteries.

In this context, the term electrochemical battery refers especially to a so-called secondary battery of the motor vehicle in which the consumed chemical energy can be restored by means of an electric (re)charging process. Such batteries are particularly configured as electrochemical accumulators, for example, as lithium-ion batteries. In order to generate or provide a sufficiently high operating voltage, such batteries typically have several individual battery cells that are modularly interconnected.

The batteries or battery cells are made, for instance, of foil-like battery electrodes. As a rule, the battery electrodes have an active-material coating onto which a foil material, especially a copper or aluminum foil, has been applied.

Within the scope of the production, the battery electrodes or the coated foil materials of a battery cell or of a battery have to be electrically conductively connected to a current arrester or to an arrester lug (busbar, arrester tab). In this context, the connection is typically established in the form of one or more welds by means of a welding process, for instance, a laser or ultrasound welding process.

The grade and quality of the welded connection or of the weld on the battery components is relevant for the quality of the battery or battery cell thus produced. Consequently, with an eye towards reducing the number of rejects and improving understanding of the process, it is desirable for the generated welded connections or welds on the battery components to be examined and/or tested, non-destructively if at all possible, and preferably inline, in other words, during the production process in the production or manufacturing line.

Characterization, in other words, an inspection and examination and/or testing of welded connections is possible, for example, by means of an x-ray analysis, especially employing computer tomography (CT), or else by means of ultrasound measurement. A drawback of x-ray measurements is that they are relatively time-consuming and costly, so that they cannot be carried out inline. When it comes to ultrasound measurements, the need for a coupling medium is particularly problematic so that inline use is basically not possible. Moreover, electric resistance measurements over the weld are also conceivable in order to examine and/or test the welded connections. However, the sensitivity of electric resistance measurements is too low to examine welds on battery components. Besides, such resistance measurements say very little about the mechanical strength of the weld.

Tensile tests, for example, can be carried out in order to evaluate the mechanical stability of the welded connections. Such a tensile test ascertains, for instance, the (tensile) strength and the deformation behavior of the weld up to a breaking point. This, however, destroys the welded connection and thus the battery cell or the battery, as a result of which the battery cells or the batteries become rejects and cannot be utilized.

For the reasons outlined above, welds are typically not characterized inline during the production of battery elements. Consequently, during the configuration of the welds, a safety factor is usually dimensioned sufficiently large so that the quality of the weld is ensured, even in the case of merely sporadic inspection or characterization. This normally entails accepting financial disadvantages as well as a higher number of rejects after the production or manufacture of the battery elements.

SUMMARY OF THE INVENTION

The invention is based on the objective of putting forward a very well-suited method for the production of a battery element. In particular, a production process for battery cells is to be optimized. Preferably, the invention should allow an examination and/or testing of welded connections between components, preferably between battery components, that is simple and that can be carried out inline. The invention is also based on the objective of putting forward a very well-suited device as well as a very well-suited vehicle battery.

Pertaining to the method, the objective is achieved according to the invention pertaining to the use, pertaining to the device, and pertaining to the vehicle battery. Advantageous embodiments and refinements are the subject matter of the claims.

The method according to the invention is suitable and configured for characterizing, in other words, inspecting, or for examining and/or testing at least one joined connection between at least two components.

The joined connection is, for instance, a welded connection or a preferably electrically conductive adhesive connection, or a mechanical connection such as, for example, a screwed connection, or else a combination of these types of connections. Below, the term joined connection—without restricting the generality of the term—is to be understood particularly as a welded connection.

Here, the components or joining members are joined, for instance, integrally bonded, by means of a welded connection while forming the at least one weld. This means that, when the welded connection of the components is made, at least one weld is created. The term "weld" as set forth here and below refers especially to the spatial extension and/or the spatial course of the welded connection or of the integral bond brought about by the welding process.

According to the method, at least one eddy-current sensor makes several consecutive passes over the joined connection, thereby generating a plurality of data sets of the detected measuring signals in various parallel sectional planes of the weld. On the basis of the plurality of data sets, a projection data set is subsequently determined as the measure of the spatial distribution of the measuring signals along the at least one joined connection. This results in a highly suitable method for characterizing a weld.

According to the invention, the weld or each weld or joined connection is thus characterized non-destructively by means of an eddy-current measurement. Such an eddy-current measurement makes use of the fact that impurities and damage, in other words, defects or flaws in the electrically conductive weld, have an influence on the electric conductivity or permeability of the weld. Due to the electromagnetic alternating fields of the eddy-current sensor which, as described above, is passed over the weld, the induced voltage causes eddy currents to be generated in the weld. In this context, the sensor serves simultaneously as a transmitter and as a receiver, so that the influence that the above-mentioned defects in the weld have on the induced eddy currents is detected, allowing a simple and less laborious as well as non-destructive examination and/or testing of the weld or of or each weld.

For the eddy-current measurement, according to the invention, at least one eddy-current sensor is provided which can be moved along the at least one weld and which generates a data set of the detected measuring signals during such a movement. The eddy-current sensor generates, for example, an electromagnetic alternating field, whereby the movement of the eddy-current sensor along the weld causes electric voltages and consequently eddy currents to be induced into the material of the weld. The eddy currents are detected by means of the eddy-current sensor as measuring signals or density values and a data set is generated on this basis. For purposes of detecting the measuring signals, the eddy-current sensor has, for instance, a detection coil that detects the influence that the structure of the weld has on the induced currents.

According to the invention, it is provided for the eddy-current sensor to be moved consecutively several times along the at least one weld. This means that, for purposes of characterizing the weld in question, the eddy-current sensor is consecutively passed several times over the weld site that is to be examined and/or tested. In other words, the at least one eddy-current sensor travels over the weld several times. A data set of the appertaining measured data or measuring signals is created with every pass. Preferably, the measuring signals are generated during various passes in various parallel sectional planes of the weld. This essentially creates an eddy-current image of the weld. This means that internal spatial structures of the weld, especially the positions, distribution and/or intensity of defects or flaws, can be determined on the basis of the data sets stemming from the passes. For instance, image data in the form of (two-dimensional) sectional images or sectional views of the sectional plane in question is generated on the basis of the individual data sets. In addition or as an alternative, three-dimensional image data can also be calculated on the basis of the data sets. In this process, flaws and defects of the weld can be detected and characterized in the image data, for example, by means of image-recognition algorithms.

Advantageously, the eddy-current sensor is configured here so as to be appropriate for testing, in other words, its dimensions and design are adapted to the battery elements in such a way as to allow a reliable and simple inline characterization of the joined connection. In other words, the geometry of the sensor is configured with an eye towards the design of the product, that is to say, as a function of the type of joint (parallel joint, butt joint), the geometry of the component, the electric characteristic quantities and the shape of the joined connection.

In a conceivable embodiment, the weld or each weld is characterized using several eddy-current sensors. This allows a faster examination and/or testing, as a result of which the cycle times for the characterization are advantageously reduced. In this context, it is conceivable, for instance, that multiple passes of one eddy-current sensor over the weld have the same effect as one single pass using several eddy-current sensors.

According to the method, on the basis of the plurality of data sets, a projection data set is determined as the measure of the spatial distribution of the measuring signals along the at least one weld. In order for the projection data set to be generated, the individual data sets are preferably superimposed or added up. This translates into a simple evaluation of the measuring signals as well as into a simple and less laborious characterization of the weld. In particular, the requisite computational capacity for generating and evaluating the projection data set is considerably reduced in comparison to the determination of a three-dimensional tomographic data set.

The transfer function of the measuring signals of the eddy-current sensor, in other words, the course of the measuring signals when, for example, a punctiform defect such as especially a pore, an impurity phase or a phase boundary is scanned, exhibits a well-defined, for instance, circular or circular-ring shaped structure. Consequently, the projection data set allows a simple and reliable characterization of the weld or of each weld.

In an advantageous refinement, the data sets of the plurality of data sets are added up in order to determine the projection data set along a direction that is oriented essentially perpendicular to the sectional planes. In other words, the plurality of data sets is summed up or added up to form the projection data set. Thus, the size of the data sets is effectively reduced. In this context, the projection data set is preferably only a two-dimensional data set. This allows for a very simple and effective characterization of the weld or of each weld. As an alternative with an eye towards reducing the size, a single section in the eddy-current signal through the center of the weld is likewise possible.

In a practical refinement, a curve progression or a fit function is adapted to or fitted to the projection data set. The at least one weld is characterized on the basis of the adapted curve progression, a process in which flaws and/or defects of the weld are determined. In particular, the position and/or the intensity of the flaws and/or defects of the weld are determined on the basis of the curve progression. This translates into a very high information content for characterizing the weld. Consequently, the welds can be very easily and reliably characterized, thereby ensuring a high quality of the welding process.

Moreover, methods from the realm of artificial intelligence can likewise be employed with the aim of allowing an evaluation of the measured results. If a sufficiently large database containing the eddy-current measurements and the corresponding quality parameters (e.g. electric resistance and tensile strength) is available, it is then possible, for example, that a convolutional neural network can be trained to automatically extract the relevant features from the eddy-current signal.

In a suitable embodiment, the eddy-current sensor is passed over a number of adjacent welds of the components, whereby a shared projection data set is determined as the measure of the spatial distribution of the measuring signals along the welds. In other words, the data sets or measuring signals or else density values pertaining to several welds are summed up or added up to form the shared projection data set. This means that the number of adjacent welds is preferably not characterized individually but rather together. This allows a characterization that is very simple and reduced in terms of time and computational capacity requirements.

In a preferred embodiment, the projection data set is compared to a stored reference data set. In this context, the reference data set is especially a data set of reference threshold values of an exemplary weld or reference weld or of a component sample. Here, the reference threshold values relate particularly, for example, to the position and/or the intensity of a defect and/or flaw of the weld. In a conceivable embodiment, the joined components can be characterized as rejects if a flaw and/or defect reaches or exceeds one or more reference threshold values of the reference data set. This translates into a very simple and practical method for serial utilization.

In an advantageous configuration, the at least one eddy-current sensor is tilted and/or swiveled over the course of consecutive movements or passes along the weld. This causes the sectional planes in which the measuring signals are generated and detected to likewise tilt or swivel, in other words, to become inclined by a certain angle. This improves the spatial resolution within the scope of the examination and/or testing of the at least one weld, thereby allowing a more precise and more effective determination of flaws and/or defects.

In a preferred use, the method described above is employed in a production process for a battery element. This means that the method according to the invention is preferably employed for the production of a battery element, for instance, a battery cell or a battery. Fundamentally speaking, the method can also be used for other welded components in which at least one weld needs to be inspected. The advantages and embodiments elucidated in conjunction with the method can also be correspondingly applied to the use and vice versa.

During the production of the battery element, at least two battery components situated adjacent to each other are joined together as components by means of a welded connection.

For example, if the battery components are arranged so as to be stacked above each other here, this means that at least two battery components are arranged so as to overlap in some sections, whereby the welded connection is especially effectuated in the overlapping area. As an alternative, for instance, it is likewise conceivable for the battery components to be arranged in the form of a parallel joint or else adjacent to each other (butt joint).

Therefore, at least one weld is created when the welded connection is made. In this context, the at least one weld is characterized by means of the method described above. Thanks to the characterization method according to the invention, the production process of the battery elements is markedly improved. In particular, this allows a simple, cost-effective as well as non-destructive examination and/or testing of welded connections between the battery components. The joined or welded battery components are especially foil elements of the battery element. During the welding process, for instance, one or more battery electrodes are contacted and connected to a current arrester or to an arrester lug or to a busbar.

In a preferred embodiment, the characterization of the at least one weld, in other words, the eddy-current examination, is carried out inline. This means that the eddy-current measurement is configured so as to be integrated into the process for the production of the battery element. In other words, the eddy-current measurement is carried out within the manufacturing or production line, for example, on the fly, as a result of which a very smooth production and manufacture of the battery element become possible.

The inline eddy-current measurement for purposes of characterizing or inspecting the welds diminishes the number of rejects, consequently advantageously reducing the production and manufacturing costs of the battery element. In particular, this allows full automation of the examination and/or testing which preferably takes place in unison with the production cycle.

Moreover, inline eddy-current measurement allows automatic feedback into the process parametrization as well as improved process control by means of the weld characterization. This allows, for example, a setpoint/actual-value comparison in order to check the dimensional stability or deformation of the welds created, for instance, by means of a comparison to a reference data set. Moreover, this also improves knowledge about the process during the creation of the welded connections, which is conducive to improving the weld quality and thus the quality of the battery elements.

The device according to the invention is suitable and configured for the production of a battery or a battery cell. In this context, the device has a welding apparatus to create an integrally bonded welded connection of at least two battery components that are arranged so as to be stacked above each other. The welding apparatus is suitable and configured, for instance, for ultrasonic welding or laser beam welding. The battery components that are to be joined or welded together are, for example, a battery electrode and a current arrester or else an arrester tab or a busbar. The device also has an eddy-current sensor for generating and detecting eddy currents in the vicinity of at least one weld that had been created by the welding apparatus. The welding apparatus and the eddy-current sensor are coupled to a controller, that is to say, to a control unit. This translates into a highly suitable device for the production of battery elements.

The advantages and configurations cited in conjunction with the method and/or the use can be commensurately transferred to the device and vice versa.

In this context, the controller—either by means of programming or circuitry—is generally configured to carry out the method or the use according to the invention as described above. Therefore, the controller is concretely configured to use the eddy-current sensor to induce eddy currents in the weld or in the vicinity of the weld following a welding process with the welding apparatus, and to detect and evaluate these eddy currents or the distribution and intensity of the eddy currents in the weld or in its vicinity. In particular, the controller is suitable and configured to control and/or to regulate the manufacturing or production process of the battery element on the basis of the characterized weld.

In a preferred embodiment, the controller is formed, at least essentially, by a microcontroller having a processor and a data memory in which the functionality for carrying out the method according to the invention has been technically implemented as a program in the form of firmware, so that the method—if applicable interacting with a device user—is automatically carried out in the microcontroller when the firmware is executed. Within the scope of the invention, the controller can also alternatively be formed by a non-programmable electronic component such as, for instance, an application-specific integrated circuit (ASIC) in which the functionality for carrying out the method according to the invention has been technically implemented by means of circuitry.

In a preferred embodiment, the eddy-current sensor is configured as a fork sensor having a transmission geometry, in other words, a transmission fork sensor. This yields a very practical eddy-current sensor.

The fork sensor here has, for example, an approximately horseshoe-shaped or U-shaped (sensor) housing, whereby a transmitting coil and a receiving coil situated across from it are arranged in the vicinity of the free ends of the vertical U-leg. In this context, the coils are suitably connected to the controller according to a transformer principle. In this process, the excitation frequency of the coils, in other words, the frequency of the magnetic field that is generated when the coil is energized, is selected in such a way as to ensure a sufficient penetration thorough the electrically conductive material of the welded connection.

For purposes of examining the welded connection, the battery element is inserted into the fork opening (jaw opening) between the legs. Owing to its forked shape, the eddy-current sensor can be simply moved and/or swiveled along the welded connection.

The vehicle battery according to the invention is especially configured as a traction battery of a motor vehicle that is or can be electrically powered, for instance, an electric and/or hybrid vehicle. The vehicle battery has at least one battery element that is produced by means of the method described above or by means of the use of the method described above. This translates into a highly suitable vehicle battery. In particular, the quality of the weld of the battery element, which is very high due to the method, is advantageously reflected in the quality of the vehicle battery, as a result of which its range and service life are improved.

The advantages and embodiments cited in conjunction with the method and/or the use and/or the device can also be correspondingly applied to the vehicle battery and vice versa.

BRIEF DESCRIPTION OF THE DRAWINGS

Embodiments of the invention will be described in greater detail below on the basis of a drawing. The latter contains the following in simplified and schematic depictions.

DETAILED DESCRIPTION OF THE INVENTION

Figure 1:
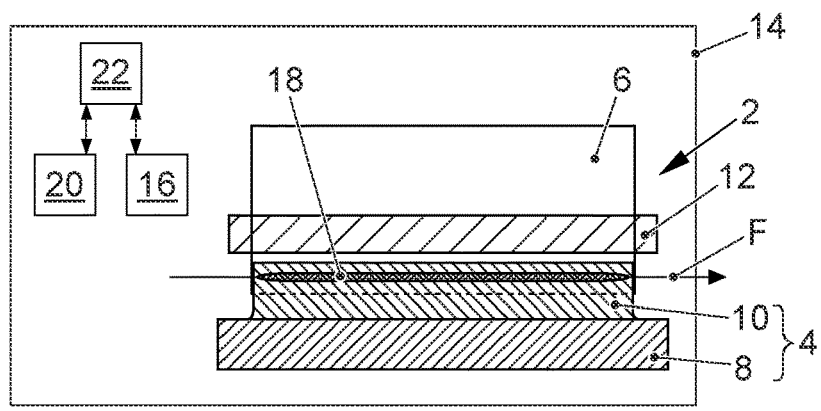
FIG. 1 shows a top view of a device for the production of a battery element.

FIGS. 1 to 4 each show a battery element 2 of a vehicle battery (not shown here in greater detail). The battery element 2 has two battery components 4, 6 as parts.

The battery element 2 is, for example, a battery cell, whereby the battery component 4 here is especially configured as a battery electrode having a coating 8 and a collector foil 10, and whereby the battery component 6 is especially configured as an arrester tab. In order to improve the attachment in the vicinity of the battery component or of the arrester tab 6 to a housing part of the battery element 2 (not shown here in greater detail), a so-called pre-sealing tape 12 is arranged in the vicinity of the battery component 6. The pre-sealing tape 12 effectuates a minimum distance for purposes of electric insulation between the voltage-carrying arrester tab 6 and the housing part.

FIG. 1 also schematically shows a highly simplified depiction of a device 14 for the production of the battery element 2.

The device 14 here has a welding apparatus 16 for creating the integrally bonded welded connection of the battery components 4 and 6, which are arranged so as to be stacked above each other, at least in certain sections. The welding apparatus 16 is suitable and configured, for instance, for ultrasonic welding or laser beam welding. In this context, the welding apparatus 16 is moved, for instance, along a joining direction F, a process in which the battery components 4, 6 are integrally bonded by means of at least one joint or weld 18.

The device 14 also has an eddy-current sensor 20 for characterizing or inspecting the at least one weld 18. The eddy-current sensor 20 here is suitable and configured for generating and detecting eddy currents in the vicinity of the at least one weld 18.

The welding apparatus 16 and the eddy-current sensor 20 are coupled to a controller 22, that is to say, to a control unit.

In the embodiment shown in FIG. 1, the battery element 2 has a single, longitudinal weld 18. In other words, the battery components 4 and 6, especially the arrester tab 6 and the collector foil 10, are welded together by means of a weld 18.

Figure 2:
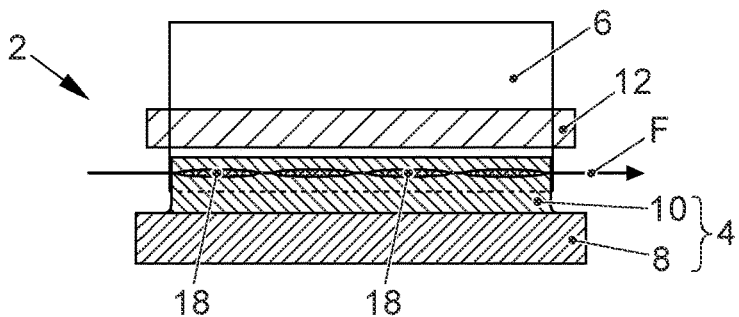
FIGS. 2 to 4 show each a top view of the battery element with an arrester tab and collector foil, which are integrally bonded by means of a number of welds.

The embodiment shown in FIG. 2 depicts the battery element 2 with four longitudinal welds 18 distributed along the joining direction F. In the embodiments shown in FIG. 3 and FIG. 4, the battery components 4 and 6 are each connected to a plurality of approximately punctiform welds (welding points) 18, which are arranged so as to be distributed, for example, in two rows perpendicular to the joining direction F. In the embodiment shown in FIG. 3, the rows are arranged so as to be stacked above each other, whereas in the embodiment shown in FIG. 4, the rows are arranged offset with respect to each other. The welds 18 shown in the figures are provided with reference numerals only by way of an example.

A method according to the invention for characterizing or inspecting at least one weld 18 is explained in greater detail below making reference to FIG. 5. The depiction in FIG. 5 has four sections 24, 26, 28 and 30 arranged horizontally one above the other. Each section shows one method step for characterizing the at least one weld 18.

In the first method step depicted in section 24, the eddy-current sensor 20 is consecutively moved several times along the at least one weld 18. In this process, the eddy current sensor 20 is moved linearly along the joining direction F and thereby consecutively passed several times over the weld site that is to be examined and/or tested. The measured data or measuring signals (sensor signals) 32 are transmitted to the controller 22 for evaluation.

With every pass, a data set of the appertaining measuring signals 32 is created and stored in a memory of the controller 22. The measuring signals 32 are generated over the course of various passes in various parallel sectional planes 34, 36, 38 of the weld 18, whereby FIG. 5 shows three sectional planes 34, 36, 38 by way of an example.

During the course of the successive movements or passes along the weld 18, the eddy-current sensor 20 is, for example, tilted and/or swiveled. This is shown schematically in section 24 by means of a double arrow 40.

Figure 5:
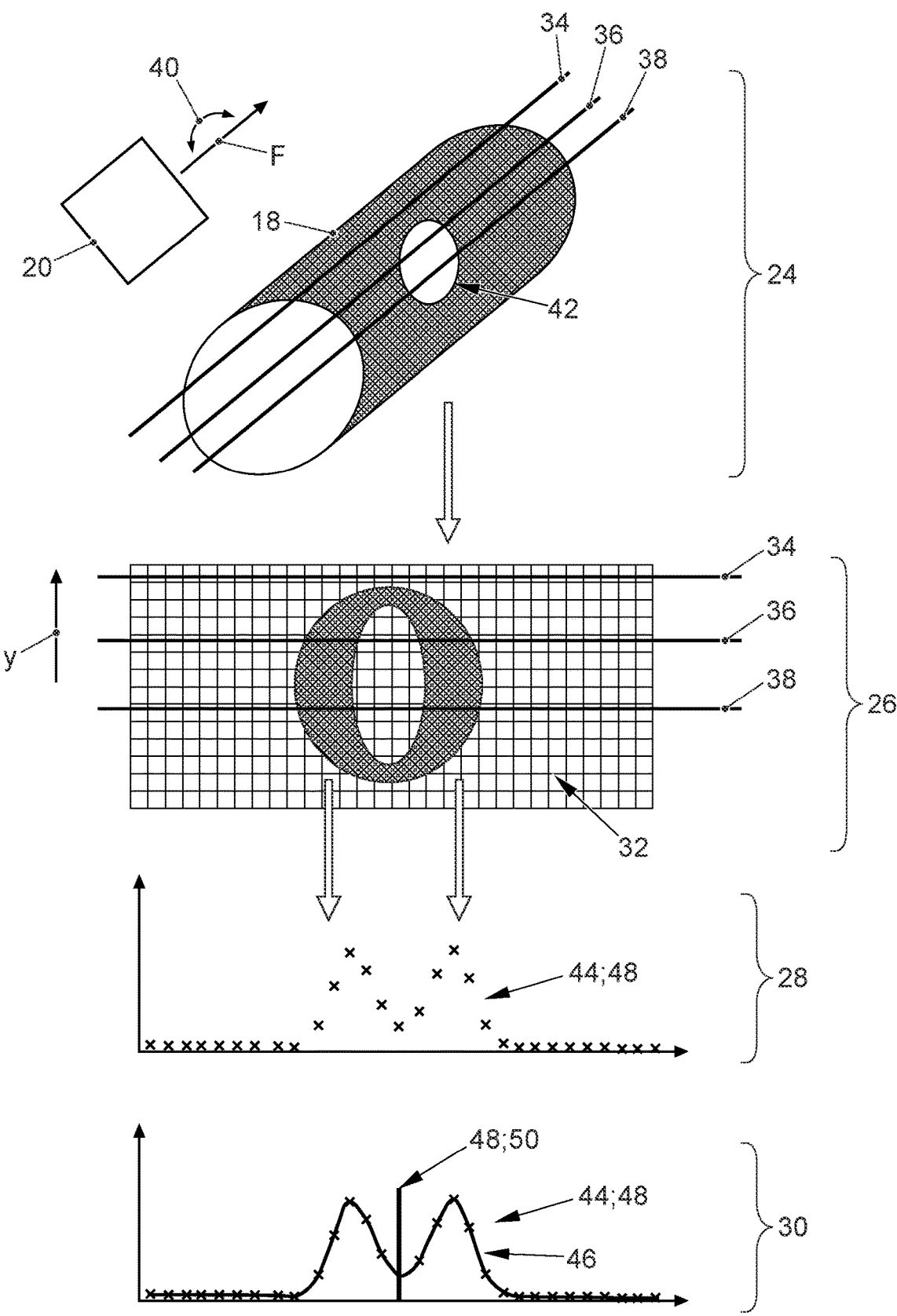
FIG. 5 shows several partial views of a method according to the invention for characterizing at least one weld.

The weld 18 shown in FIG. 5 has a somewhat punctiform defect 42. The defect 24 is, for example, a pore, an impurity phase or a phase boundary located inside the weld 18. The transfer function of the measuring signals 32 of the eddy-current sensor 20 shown in section 26, in other words, the course of the measuring signals 32 during the scanning of the defect 42, exhibits a well-defined, for instance, circular or circular-ring shaped structure.

In a subsequent method step, the controller 22 generates a projection data set 44 which is shown in section 28 and which has been created by superimposing the data sets of the measuring signals 32 stemming from the individual sectional planes 34, 36, 38. For this purpose, the measuring signals 32 or density values or the plurality of data sets along a direction y oriented essentially perpendicular to the sectional planes are summed up. In other words, the plurality of data sets is summed up or added up to form the projection data set 44. Thus, the size of the data sets is effectively reduced. As can be seen in section 28, the projection data set 44 is essentially a two-dimensional data set in a plane oriented perpendicular to the longitudinal or joining direction F.

In the method step depicted in section 30, the controller 22 adapts or fits a curve progression or fit 46 to the data of the projection data set 44. The weld 18 is characterized on the basis of the adapted curve progression 46, whereby the position and/or intensity of the defect 42 inside the weld 18 are determined.

In order to adapt or fit the curve progression 46, preferably several uniformly distributed functions are employed that result from the shape of the well-defined structure. In the embodiment shown, a hump shaped curve progression 46 results from the circular or circular-ring shaped structure of the measuring signals 32 (section 26).

In the embodiment shown, for example, two Gaussian peaks that are arranged next to each other and whose distance from each other falls only within a well-defined range are used to adapt or fit the curve progression 46.

On the basis of the intensity or amplitude of the curve progression 46 on the shapes of the data of the projection data set 44, the controller 22 is suitable and configured in such a way that essential properties of the defect 42, especially its dimension 48 and/or position 50 inside the weld 18, can be easily determined at the appertaining position. This allows a simple evaluation of the measuring signals 32, even in the case of defects 42 that are very close to each other, whereby, due to the number of fit functions, the defects 42 can essentially be resolved individually.

The curve progression 46 and/or the projection data set 44 are compared, for instance, by means of the controller 22, to a stored reference data set for threshold values of a reference sample or exemplary sample. Preferably, a characterization of the signal or curve progression 46, for example, by means of neural networks, takes place here.

The controller 22 controls and/or regulates the production process of the battery elements 2, preferably on the basis of the characterization of the created welds 18. In this context, it is possible for the battery element 2 to be characterized as a reject if, on the basis of a comparison of a threshold value to the reference data set, for instance, an intensive defect 42 is detected in the projection data set 44 and/or in the curve progression 46.

Figure 3:
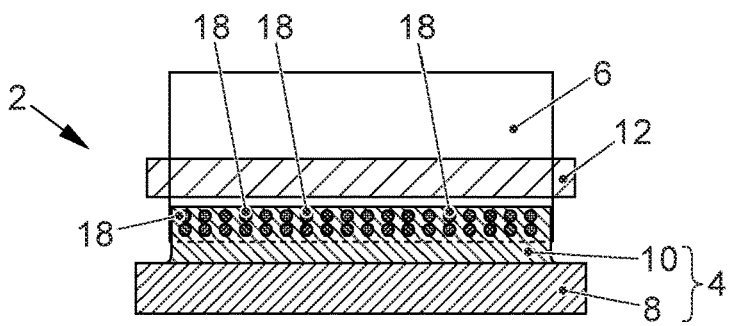
Figure 4:
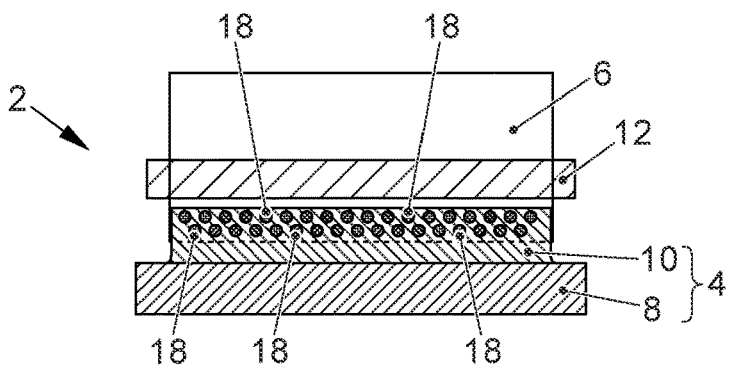

In several welds 18—such as, for instance, in the embodiments of FIGS. 2 to 4—the eddy-current sensor 20 can be guided along the joining direction F over several adjacent welds 18. In this process, the controller 22 suitably determines a shared projection data set 48 as the measure for the spatial distribution of the measuring signals 32 along the welds 18, said projection data set being evaluated according to the projection data set 44 of a single weld 18.

Figure 6:
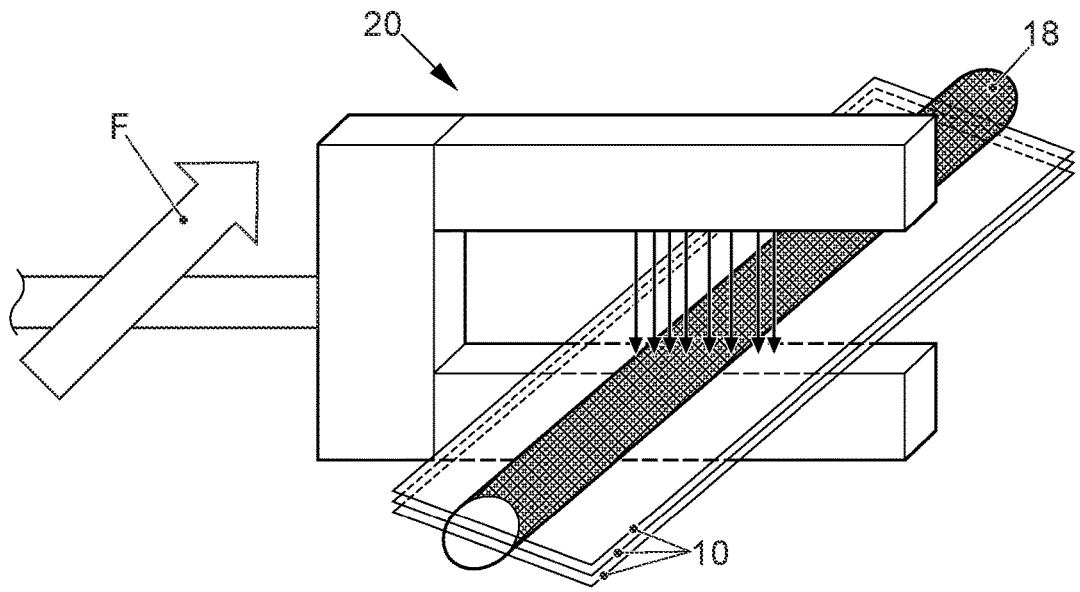
FIGS. 6 and 7 show a perspective view of an eddy-current sensor configured as a fork sensor, for examining the weld.
Figure 7:
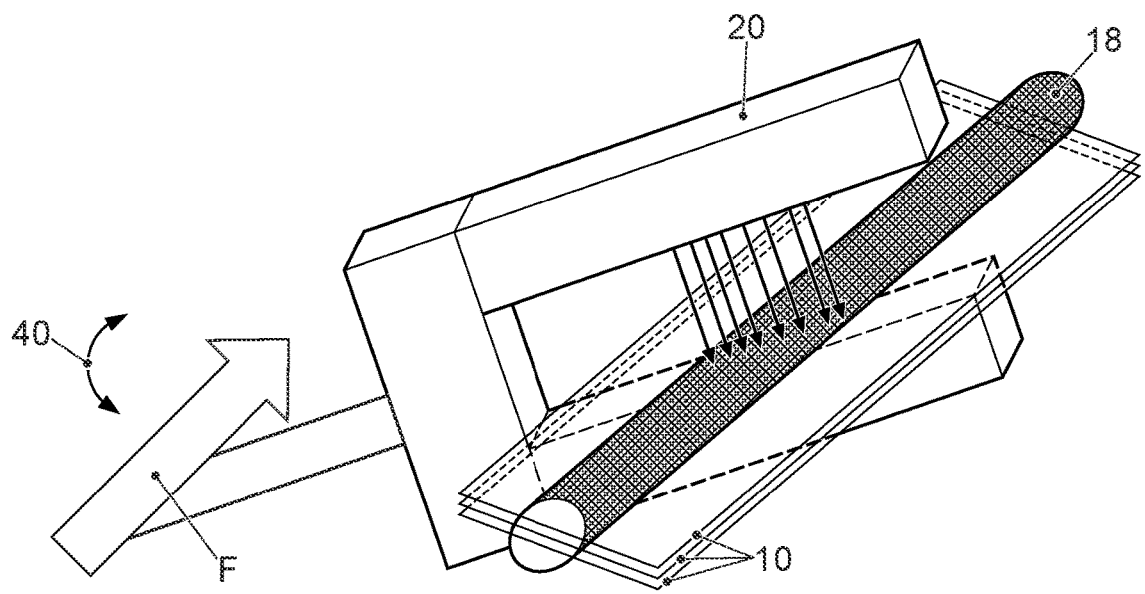

FIGS. 6 and 7 show an embodiment of the eddy-current sensor 20 in the form of a transmission fork sensor.

In this context, the fork sensor 20 has, for instance, an approximately horseshoe-shaped or U-shaped (sensor) housing 50, whereby a transmitting coil and a receiving coil situated across from it are arranged in the vicinity of the free end of the vertical U-leg. In this context, the coils (not shown in greater detail here) are connected to the controller according to a transformer principle. In this process, the excitation frequency of the coils is selected in such a way as to ensure sufficient penetration through the electrically conductive material of the welded connection 18.

The invention being claimed here is not restricted to the embodiments described above. Rather, the person skilled in the art can also derive other variants of the invention within the scope of the disclosed claims without departing from the subject matter of the invention being claimed here. In particular, all of the individual features described in conjunction with the embodiment within the scope of the disclosed claims can also be combined in a different manner without departing from the subject matter of the invention being claimed here.

LIST OF REFERENCE NUMERALS 2 battery element
4 battery component/part
6 battery component/part/arrester tab
8 coating
10 collector foil
12 pre-sealing tape
14 device
16 welding apparatus
18 joined connection/weld
20 eddy-current sensor/fork sensor
22 controller
24, 25, 28, 30 section
32 measuring signals
34, 36, 38 sectional plane
40 arrow
42 defect
44 projection data set
46 curve progression
48 projection data set
50 housing
F joining direction
Y direction

The invention claimed is:

1. A method for characterizing at least one joined connection between at least two joined components, comprising:
consecutively moving an eddy-current sensor several times over the at least one joined connection, thereby generating a plurality of data sets of detected measuring signals in various parallel sectional planes of the joined connection,
determining, on the basis of the plurality of data sets, a projection data set as a measure of a spatial distribution of the measuring signals along the at least one joined connection,
adding the data sets in order to determine the projection data set along a direction (y) that is oriented perpendicular to the sectional planes,
adapting a curve progression to the projection data set, whereby, on the basis of the adapted curve progression, flaws and/or defects of the at least one joined connection are determined,
comparing the projection data set to a stored reference data set, and characterizing the joined components as rejects if a flaws and/or defect in the projection data set reaches or exceeds a reference threshold value of the reference data set.

2. The method according to claim 1, further comprising passing the eddy-current sensor over a number of adjacent joined connections of the components, whereby a shared projection data set is determined as the measure of the spatial distribution of the measuring signals along each joined connection.

3. The method according to claim 1, further comprising tilting and/or swiveling the eddy-current sensor over the course of consecutive movements along the at least one joined connection.

4. The method according to claim 1, for a production of a battery element, further comprising:
joining together at least two battery components situated adjacent to each other by means of a welded connection, whereby at least one weld is made as the joined connection.

5. A device for the production of a battery element, comprising
a welding apparatus configured to create an integrally bonded welded connection of at least two battery components that are arranged so as to be stacked above each other,
an eddy-current sensor configured to generate and detect eddy currents in the vicinity of at least one joined connection that has been created by the welding apparatus, and
a controller for execution of the method according to claim 1.

6. The device according to claim 5, wherein the eddy-current sensor is configured as a fork sensor having a transmission geometry.

7. A vehicle battery of a motor vehicle that is or can be electrically powered, comprising at least one battery element produced according to the method of claim 4.

* * * * *